(12) United States Patent
Kalistaja et al.

(10) Patent No.: US 9,325,060 B2
(45) Date of Patent: Apr. 26, 2016

(54) METHODS AND APPARATUS FOR CONDUCTIVE ELEMENT DEPOSITION AND FORMATION

(71) Applicant: Pulse Finland OY, Kempele (FI)

(72) Inventors: Esa Kalistaja, Oulu (FI); Elli Galla, Muhos (FI); Dan Kuehler, San Diego, CA (US); Winthrop Childers, San Diego, CA (US)

(73) Assignee: Pulse Finland OY, Oulunsalo (FI)

( * ) Notice: Subject to any disclaimer, the term of this patent is extended or adjusted under 35 U.S.C. 154(b) by 0 days.

(21) Appl. No.: 14/620,108

(22) Filed: Feb. 11, 2015

(65) Prior Publication Data

US 2015/0229025 A1     Aug. 13, 2015

Related U.S. Application Data

(60) Provisional application No. 61/939,197, filed on Feb. 12, 2014.

(51) Int. Cl.
*H01Q 9/04*     (2006.01)
*H05K 3/32*     (2006.01)
*H01Q 1/38*     (2006.01)
*H05K 3/12*     (2006.01)

(52) U.S. Cl.
CPC .................. *H01Q 1/38* (2013.01); *H05K 3/125* (2013.01); *H05K 2201/0245* (2013.01); *H05K 2201/0999* (2013.01); *H05K 2201/10098* (2013.01)

(58) Field of Classification Search
CPC ...................................................... H01Q 1/243
USPC ................................................... 343/700 MS
See application file for complete search history.

(56) References Cited

U.S. PATENT DOCUMENTS

| | | |
|---|---|---|
| 3,614,554 A | 10/1971 | Shield et al. |
| 4,253,231 A | 3/1981 | Nouet |
| 4,547,961 A | 10/1985 | Bokil et al. |
| 4,847,986 A | 7/1989 | Meinel |
| 5,055,816 A | 10/1991 | Altman et al. |

(Continued)

FOREIGN PATENT DOCUMENTS

| | | |
|---|---|---|
| CN | 1262492 A | 8/2000 |
| CN | 1484935 A | 3/2004 |

(Continued)

OTHER PUBLICATIONS

"Micrometer glass nozzles for flow focusing", J. M. Montanerot, A. M. Gãnán-Calvo‡, A. J. Acero †, E. J. Vega†, D. P. DePonte et al., J. Phys. D 41 (2008). Abstract and pp. 1-10.*

(Continued)

*Primary Examiner* — Dameon E Levi
*Assistant Examiner* — Andrea Lindgren Baltzell
(74) *Attorney, Agent, or Firm* — Gazdzinski & Associates PC

(57) ABSTRACT

A conductive element such as an antenna, for use in electronic devices, including mobile devices such as cellular phones, smartphones, personal digital assistants (PDAs), laptops, and wireless tablets. In one exemplary aspect, the present disclosure relates to a conductive antenna formed using deposition of conductive fluids as well as the method and equipment for forming the same. In one embodiment, a "thick" antenna element can be formed in one pass of a dispensing head or nozzle, thereby reducing manufacturing cost and increasing manufacturing efficiency.

30 Claims, 13 Drawing Sheets

(56) References Cited

U.S. PATENT DOCUMENTS

| | | |
|---|---|---|
| 5,126,714 A | 6/1992 | Johnson |
| 5,257,000 A | 10/1993 | Billings et al. |
| 5,487,214 A | 1/1996 | Walters |
| 5,781,091 A | 7/1998 | Krone et al. |
| 6,165,386 A | 12/2000 | Endo et al. |
| 6,440,750 B1 | 8/2002 | Feygenson et al. |
| 6,445,271 B1 | 9/2002 | Johnson |
| 6,533,866 B1 | 3/2003 | Franz et al. |
| 6,745,058 B2 | 6/2004 | Boulay et al. |
| 6,962,511 B2 | 11/2005 | Gutierrez et al. |
| 7,112,246 B2 | 9/2006 | Schucker |
| 7,241,181 B2 | 7/2007 | Machado et al. |
| 7,311,937 B2 | 12/2007 | Hashimoto |
| 7,345,645 B2 | 3/2008 | Cho |
| 7,480,979 B2 | 1/2009 | Moren |
| 7,642,918 B2 | 1/2010 | Kippelen et al. |
| 7,782,211 B2 | 8/2010 | Yamaguchi et al. |
| 7,859,481 B2 | 12/2010 | Muraoka |
| 8,115,684 B2 | 2/2012 | Palin |
| 8,148,818 B2 | 4/2012 | Yamazaki et al. |
| 8,237,248 B2 | 8/2012 | Yamazaki et al. |
| 8,284,117 B2 | 10/2012 | Kim et al. |
| 8,405,561 B2 | 3/2013 | Handy et al. |
| 8,679,573 B2 | 3/2014 | Sciver et al. |
| 2001/0043135 A1 | 11/2001 | Yamada et al. |
| 2002/0121959 A1 | 9/2002 | Fontana et al. |
| 2003/0173678 A1* | 9/2003 | Mizukoshi .......... 257/774 |
| 2004/0144958 A1 | 7/2004 | Conaghan et al. |
| 2004/0203173 A1* | 10/2004 | Peck et al. .......... 436/180 |
| 2005/0266154 A1 | 12/2005 | Devos et al. |
| 2006/0159899 A1 | 7/2006 | Edwards et al. |
| 2006/0176139 A1 | 8/2006 | Pleskach et al. |
| 2006/0290457 A1 | 12/2006 | Lee et al. |
| 2007/0001796 A1 | 1/2007 | Waffenschmidt et al. |
| 2007/0102685 A1* | 5/2007 | Kodas et al. .......... 252/500 |
| 2007/0216510 A1 | 9/2007 | Jeong et al. |
| 2008/0204516 A1 | 8/2008 | Kim et al. |
| 2009/0145640 A1 | 6/2009 | Toyoda |
| 2009/0146658 A1* | 6/2009 | McDowell et al. .......... 324/309 |
| 2009/0207198 A1 | 8/2009 | Muraoka |
| 2009/0226605 A1 | 9/2009 | Chopra et al. |
| 2010/0011568 A1 | 1/2010 | Harding |
| 2010/0127084 A1 | 5/2010 | Pavate et al. |
| 2011/0050381 A1 | 3/2011 | Olson |
| 2011/0096388 A1 | 4/2011 | Agrawal et al. |
| 2011/0140978 A1 | 6/2011 | Maruyama |
| 2011/0285492 A1 | 11/2011 | Wang et al. |
| 2012/0038514 A1 | 2/2012 | Bang |
| 2012/0058676 A1 | 3/2012 | Schaffer et al. |
| 2012/0081420 A1 | 4/2012 | Yu et al. |
| 2012/0146855 A1 | 6/2012 | Spencer et al. |
| 2012/0235879 A1 | 9/2012 | Eder et al. |
| 2012/0319905 A1 | 12/2012 | Fan et al. |
| 2013/0076572 A1 | 3/2013 | Lee |
| 2013/0076573 A1 | 3/2013 | Rappoport et al. |
| 2013/0076574 A1 | 3/2013 | Rappoport et al. |
| 2013/0176176 A1 | 7/2013 | Vos et al. |
| 2013/0229314 A1 | 9/2013 | Kuehler et al. |
| 2013/0234899 A1 | 9/2013 | Pope et al. |

FOREIGN PATENT DOCUMENTS

| | | |
|---|---|---|
| CN | 101189625 A | 5/2008 |
| EP | 2065837 A1 | 6/2009 |
| EP | 2418924 A1 | 2/2012 |
| EP | 2693564 | 5/2014 |
| JP | H0210705 A | 1/1990 |
| JP | 2013065838 A | 4/2013 |
| KR | 20040084747 A | 10/2004 |
| TW | 201030628 A | 8/2010 |
| TW | 201043114 A | 12/2010 |
| TW | M419240 U | 12/2011 |
| WO | WO-02054841 A1 | 7/2002 |

OTHER PUBLICATIONS

"Micrometer glass nozzles for flow focusing", J. M. Montanerot, A. M. Ga~n'an-Calvo‡, A. J. Acero †, E. J. Vega†, D. P. DePonte et al., J. Phys. D 41 (2008). Abstract and pp. 1-10.

Ortego, et al., Research article, Inkjet Printed Planar Coil Antenna Analysis for NFC Technology Applications, accepted Jan. 9, 2012, 7 pages.

Perelaer, et al., Inkjet Printing and Alternative Sintering of Narrow Conductive Tracks on Flexible Substrates for Plastic Electronic Applications, Feb. 2010, 23 pages.

Koski, et al., Inkjet-printed passive UHF RFID tags: review and performance evaluation, Intl. Journal of Advanced Manufacturing Technology, accepted Nov. 14, 2011, 18 pages.

Maimaiti, Study of Inkjet printing as an Ultra-Low-Cost Antenna Prototyping Method and its Application to Conformal Wraparound Antennas for Sounding Rocket Sub-Payload, Utah State Univ., 2013, 85 pages.

Sowpati, et al., Performance of Printable Antennas with Different Conductor Thickness, Progress in Electromagnetics Research Letters, vol. 13, 59-65, 2010, 7 pages.

Amin, et al., Performance-Optimized Quadrate Bowtie RFID Antennas for Cost-Effective and ECO-Friendly Industrial Applications, Progress in Electromagnetics Research, vol. 126, 49-64, 2012, 16 pages.

Ahn, et al., Omnidirectional Printing of Flexible, Stretchable, and Spanning Silver Microelectrodes, Mar. 20, 2009, vol. 323, www.sciencemag.com, 4 pages.

Filton, The Printed World, Briefing 3D Printing, The Economist, Feb. 12, 2011, 3 pages.

Walker, et al., Reactive Silver Inks for Patterning High-Conductivity Features at Mild Temperatures, Journal of the American Chemical Society (JAGS), recd Oct. 1, 2011, 3 pages.

Kuilla, et al., Recent Advances in Graphene Based Polymer Composites, Progress in Polymer Science 35 (2010) 1350-1375, 26 pages.

Barrio, et al., Screen-Printed Silver-Ink Antennas for Frequency-Reconfigurable Architectures in LTE Phones, Electronics Letters, Nov. 6, 2014, vol. 50, No. 23, pp. 1665-1667, 2 pages.

Qu, et al., The Pad Printing Technology Evaluation in Mobile Phone Antenna Manufacture, Foxconn Intl Holding Group, 2010 IEEE, 4 pages.

* cited by examiner

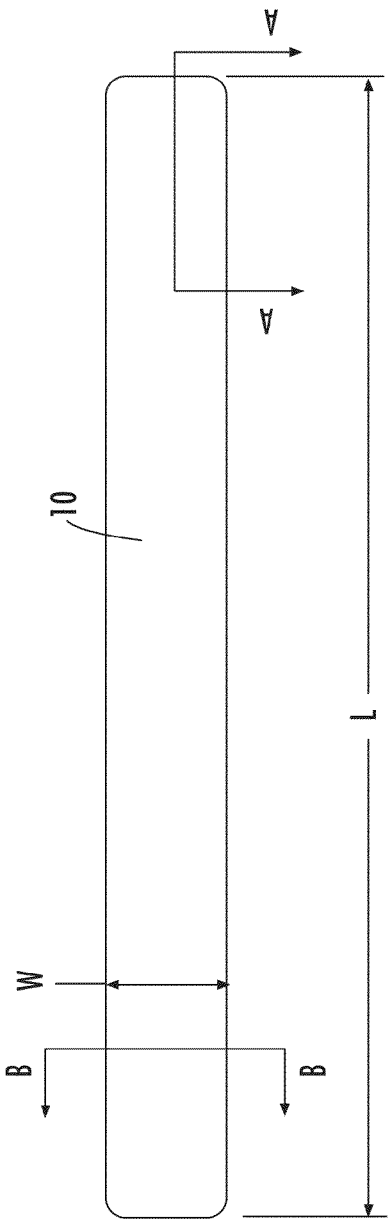
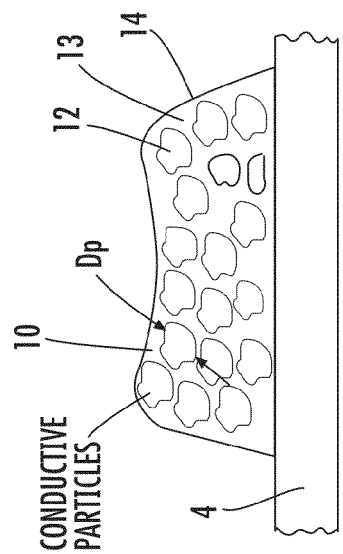
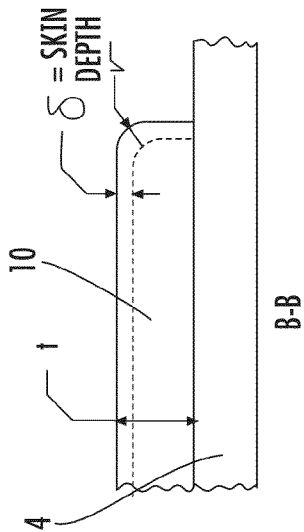
FIG. 2
FIG. 2B
FIG. 2A

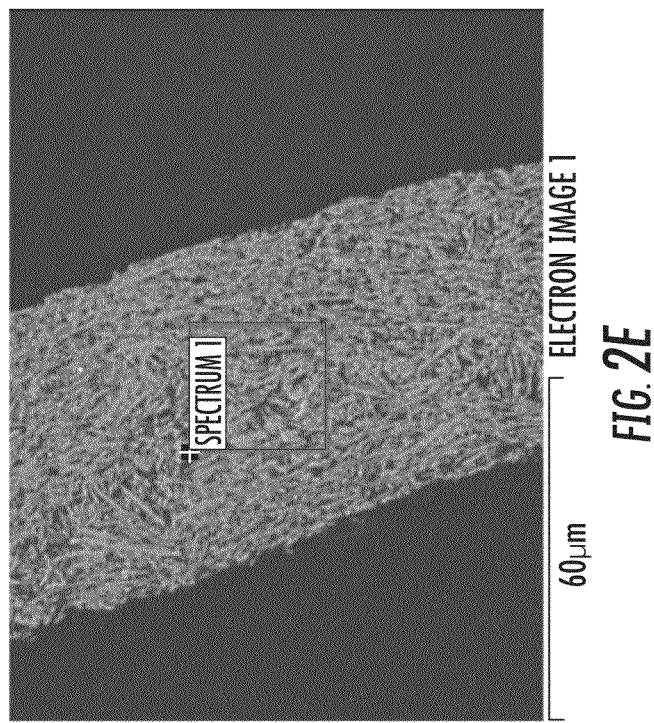
*FIG. 2E*
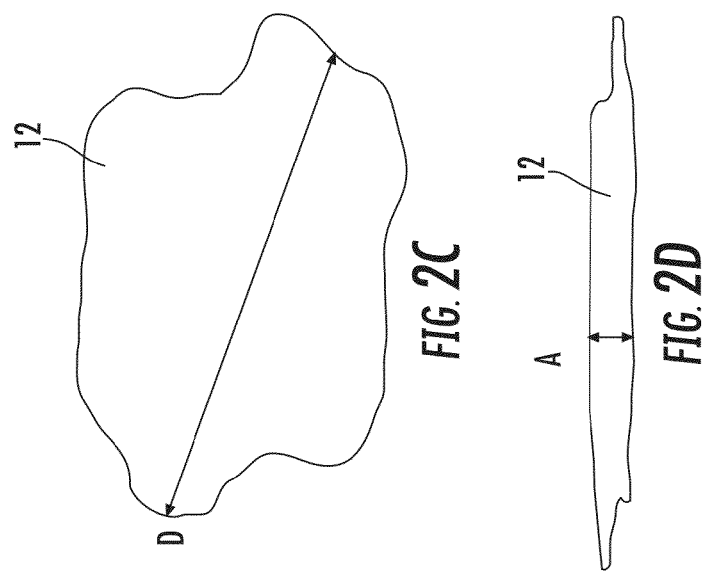
*FIG. 2C*
*FIG. 2D*

SIX AXIS ROBOT AND ROTATION AXIS

FOUR AXIS ROBOT AND ROTATION AXIS

| h | 0,5-5mm |
| H | TYPICALLY LESS THAN 1 mm |
| $D_A$ | 0,7-1,55 mm |
| $D_N$ | 70-200 μm |

METHODS AND APPARATUS FOR CONDUCTIVE ELEMENT DEPOSITION AND FORMATION

PRIORITY AND RELATED APPLICATIONS

This application claims priority to U.S. Provisional Patent Application Ser. No. 61/939,197 filed Feb. 12, 2014 entitled "DEPOSITION ANTENNA APPARATUS AND METHODS", incorporated herein by reference in its entirety. This application is also related to co-owned and co-pending U.S. patent application Ser. No. 13/782,993 entitled "DEPOSITION ANTENNA APPARATUS AND METHODS" filed Mar. 1, 2013, which claims priority to co-owned U.S. Provisional Patent Application Ser. No. 61/606,320 also entitled "DEPOSITION ANTENNA APPARATUS AND METHODS" filed Mar. 2, 2012, co-owned U.S. Provisional Patent Application Ser. No. 61/609,868 also entitled "DEPOSITION ANTENNA APPARATUS AND METHODS" filed Mar. 12, 2012, and co-owned U.S. Provisional Patent Application Ser. No. 61/750,207 also entitled "DEPOSITION ANTENNA APPARATUS AND METHODS" filed Jan. 8, 2013, each of the foregoing incorporated herein by reference in its entirety. This application is also related to co-owned U.S. Provisional Patent Application Ser. No. 62/018,410 entitled "METHODS AND APPARATUS FOR CONDUCTIVE ELEMENT DEPOSITION AND FORMATION" filed Jun. 27, 2014, and co-owned U.S. Provisional Patent Application Serial No. 62/026,560 filed Jul. 18, 2014 also entitled "METHODS AND APPARATUS FOR CONDUCTIVE ELEMENT DEPOSITION AND FORMATION", also each incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNOLOGICAL FIELD

The present disclosure relates generally to an article of manufacture and methods of (and equipment for) forming the article, including in one exemplary variant conductive element for use in, inter alia, mobile electronic devices such as cellular phones, smartphones, personal digital assistants (PDAs), laptops, and wireless electronic devices. In one exemplary aspect, the present disclosure relates to a conductive element (e.g., an antenna) formed using deposition of conductive fluids as well as the method and equipment for forming the same.

BACKGROUND

Antennas and other conductive elements are commonly found in electronic devices, including most modern radio devices (such as mobile computers, mobile phones, tablet computers, smartphones, personal digital assistants (PDAs), or other personal communication devices (PCD)). Typically, antennas comprise a planar radiating plane and a ground plane parallel thereto, which are often connected to each other by a short-circuit conductor in order to achieve the matching of the antenna. The structure is configured so that it functions as a resonator at the desired operating frequency or frequencies. Typically, these internal antennas are located internal to the device (such as within the outer plastic housing), whether free-standing, disposed on a printed circuit board (PCB) of the radio device, or on another device component, so as to permit propagation of radio frequency waves to and from the antenna(s).

Aside from the high cost of manufacturing, such prior art antennas and approaches to antenna fabrication also generally consume appreciable space within the host device. As personal electronic devices such as smartphones and tablet computers continue to shrink, greater demands are place on the antenna utilized therein both from a performance perspective and a space consumption perspective. The latter is particularly acute, since the antenna must be able to operate effectively in the desired frequency band(s), yet consume the absolute minimum space possible. With largely planar antenna solutions such as those described above, a good deal of space may be wasted, since the antenna plane must be contained entirely within the housing, and often cannot be deformed or curved, such as to accommodate the curvature of a cellular telephone exterior housing. Such housings also have internal molded features or other components attached thereto, which cause further difficulty for one trying to adapt an antenna of a particular electromagnetic configuration to the housing while using only a minimum of interior volume.

As an attempt to address some of the foregoing issues, recent advances in manufacturing processes have enabled the construction of conductive elements such as antennas directly onto the surface of a specialized material (e.g., thermoplastic material that is doped with a metal additive). The doped metal additive is activated by means of a laser in a process known as laser direct structuring (LDS), which enables the construction of antennas onto more complex 3-dimensional geometries. In various typical smartphone and other applications application, the underlying smartphone housing, and/or other components which the antenna may be disposed on inside the device, may be manufactured using this specialized material, such as for example using standard injection molding processes. A laser is then used to activate areas of the (thermoplastic) material that are to be subsequently plated. Typically an electroless copper bath followed by successive additive layers such as nickel or gold are then added to complete the construction of the antenna.

Although being very capable technology, LDS has also some disadvantages; specialized thermoplastics' material properties do not meet the properties of traditional polymer materials, but are typically more brittle or fragile. Another disadvantage is the total cost; specialized thermoplastics resins cost more than traditional ones, and lasering and plating processes are expensive. The capital cost of the LDS capacity also represents a significant barrier to entry into the technology.

Accordingly, there is a salient need for an improved conductive element solution for e.g., the antenna(s) of a portable radio device, that offers comparable electrical performance to prior art approaches while being manufactured at lower cost and using more flexible, manufacturing processes. Certain implementations of such solution would also ideally provide enhanced economies of space, and complex geometric rendering capabilities, and moreover would reduce capital investment costs and reduce barriers to entry.

SUMMARY

In a first aspect of the disclosure, a method of forming a conductive element is disclosed. In one embodiment, the method includes flowing a flowable conductive material onto a substrate via at least one pass of a dispensing apparatus, thereby forming the conductive element meeting or exceeding a prescribed ratio between a skin depth of the element and its overall depth.

In one variant, the conductive element is deposited in a single pass and at a thickness that is multiple times the effective skin depth.

In another variant, the conductive element is deposited in two or more contiguous passes, such that a "composite" trace is formed. In one exemplary implementation, the traces are in a substantially juxtaposed and parallel orientation, so as to form a single wider trace that acts as a unitary current conductor.

In a second aspect, a conductive trace is disclosed. In one embodiment, the trace is part of an antenna radiator within a portable wireless device, and is disposed on an internal surface or component (such as a housing element or substrate) of the device.

In one variant, the trace is formed via a single pass of a dispensing apparatus (e.g., nozzle).

In another variant, the trace includes a distribution of particle sizes (e.g., silver flakes having varying lengths of major axis). In another variant, the flake major axis orientation varies as a function of, inter alia, depth within the trace(s).

In yet another variant, the effective skin depth of the trace(s) is related to other parameters of the trace (e.g., depth and/or width).

In a third aspect, a deposition system is disclosed. In one embodiment, the system includes a controller, one or more multi-axis robotic apparatus, and conveyance apparatus, and a curing apparatus.

In a fourth aspect, a mobile wireless device is disclosed. In one embodiment, the device includes a low-cost deposition antenna element.

In a fifth aspect, a manufacturing process for a conductive element (e.g., deposited antenna conductor) is disclosed.

In another aspect, a method of forming an assembly having at least one conductive trace is disclosed. In one embodiment, the method is implemented using an apparatus configured to eject drops of a conductive fluid, and comprises; providing a substrate upon which the at least one trace is to be deposited; causing transport of at least a portion of apparatus over a surface of the substrate while ejecting a plurality of conductive fluid drops to form the at least one conductive trace; and heating at least the at least one trace to remove at least a portion of the conductive fluid so as to render the at least one trace substantially permanent on the substrate.

In another aspect, an article of manufacture is disclosed. In one embodiment, the article includes an antenna formed upon a surface of a substrate, and is formed by a method comprising: providing a printhead including a nozzle that is configured to eject drops of a conductive fluid including conductive silver flakes in a fluid vehicle, whereby 95% by weight of the silver flakes have a major dimension in a range of 2 µm to 20 µm; securing the article in a fixture; transporting the printhead over a surface of the article while ejecting fluid drops to form a fluid trace; and heating the trace in an oven to remove at least a portion of the fluid vehicle, whereby a resultant trace has a thickness in a range of 20 µm to 100 µm.

In another embodiment, the antenna is formed upon a surface of a substrate using a printhead including a nozzle that is configured to eject drops of a conductive fluid including conductive silver flakes in a fluid vehicle whereby 95% by weight of the silver flakes have a major dimension in a range of 2 µm to 20 µm, and the method includes: securing the article in a fixture; transporting the printhead over a surface of the article while ejecting fluid drops to form a fluid trace, whereby each pass of the printhead forms a path segment having a dry thickness that is in a range of 20 µm to 100 µm and is at two times a skin depth of the dry trace at 1 GHz; and heating the trace in an oven to remove at least a portion of the fluid vehicle.

In a further aspect, a method of forming a conductive element on at least one surface of a substrate is disclosed. In one embodiment, the method includes: ejecting a plurality of portions of a flowable conductive material having a plurality of at least partly metallic flakes entrained in a fluid vehicle onto the substrate via at least one pass of a dispensing apparatus configured to perform the ejecting, the ejecting forming the conductive element so as to at least meet or exceed a prescribed ratio between a skin depth of the conductive element and its overall depth at a prescribed frequency; and curing the conductive element and the substrate as a unit so as to drive out at least a portion of the fluid vehicle from the conductive element, and render the conductive element at least substantially permanent.

In various embodiments, a system or method of forming a conductive element can be utilized for a variety of different applications, including without limitation printing digital antennas, interconnects, and circuits on covers, inside covers, mid frames, intermediaries, and/or circuit substrates (such as PCBs or flex PCBs) for mobile and smart phones, tablets, laptops, smart watches, small cells, 3G/4G/WiFi devices, land and mobile radio, portable and mobile Point-of-Sale equipment, fine line traces for Surface-Mount Technology, VIA Technology as applied to Audio electronics, and RFID (radio frequency identification) applications. In some embodiments, the system can include an "antenna printer" which can contain "antenna writing system technology." Antenna writing system technology can refer without limitation to aspects of a printer such as print heads, print head maintenance, fluid supply systems, print engines, substrates, fluid behavior, and print system design and manufacturing, including without limitation software, firmware, development tools, drivers and media path technology, print mode, and print head motion (3D), image pipeline and processing, developing and analyzing computer simulations of different printer configurations, halftoning, image processing, defining the image transformations and the halftoning applied to the image, fluid on substrate interactions and fluid mechanics, printing process analysis, analyzing the firing frequency, the produced heat, the fluid(s) flux involved, and the total fluid(s) consumed.

BRIEF DESCRIPTION OF THE FIGURES

FIG. 2 is a plan view of an exemplary embodiment of a conductive trace 10 according to the present disclosure.

FIG. 2A is a cross section taken from section AA of FIG. 2.

FIG. 2B is a cross section taken from section BB of FIG. 2.

FIG. 2C is a top view of an exemplary conductive particle.

FIG. 2D is a side view of an exemplary conductive particle.

FIG. 2E is a SEM photograph of a cross-section of a conductive trace.

DETAILED DESCRIPTION

The present disclosure concerns, in one aspect, an article of manufacture, including in one variant a conductive element (such as an antenna) formed onto a substrate. The exemplary antenna embodiment includes a plurality of connected conductive traces. The traces may extend over a planar or non-planar or three dimensional substrate. According to the present disclosure, the traces are formed in one exemplary embodiment by moving a dispensing or deposition head nozzle over the substrate to form each trace.

In some implementations, the present disclosure enables deposition of a conductive (e.g., antenna) trace having a thickness, such as on the order of at least a factor (n) of a skin depth δ measured at a prescribed frequency (e.g., 1 GHz (Gigahertz)), with a single pass or stroke of the nozzle. For instance, n in some variants equals at least 2 (i.e., thickness at least 2×δ), and in other variants equals at least 3 (3×δ).

In another implementation, the present disclosure enables deposition of antenna trace(s) having a thickness on the order of four or five times a skin depth δ measured at 1 Ghz (Gigahertz), with a single pass or stroke of the nozzle.

The foregoing capabilities allow, inter alia, a relatively low capital cost nozzle dispensing system to rapidly form a fully functional antenna. Various exemplary optimized parameters listed below and shown in the figures provided herein are used in various embodiments to enable this advantage in capability and efficiency. Other advantageous embodiments and inventive aspects are also described in the following paragraphs.

Figure 1A:
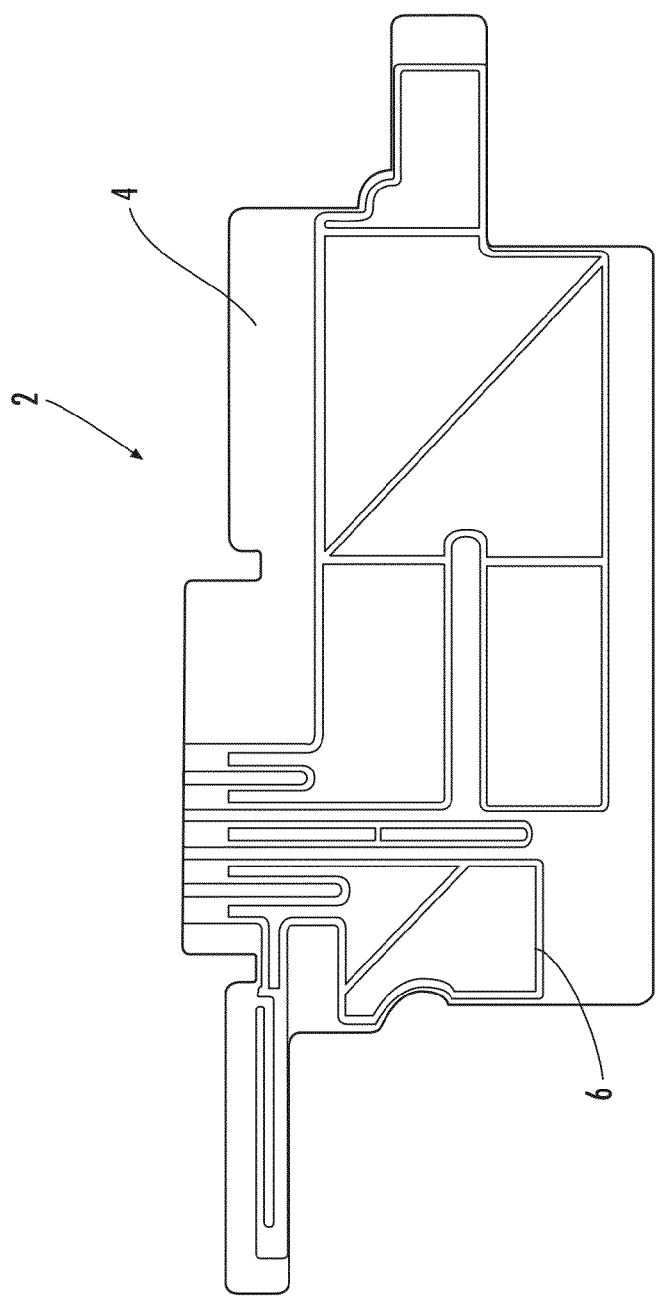
FIG. 1A is an exemplary embodiment of an article of manufacture 2 including a planar antenna 6 according to the present disclosure.
Figure 1B:
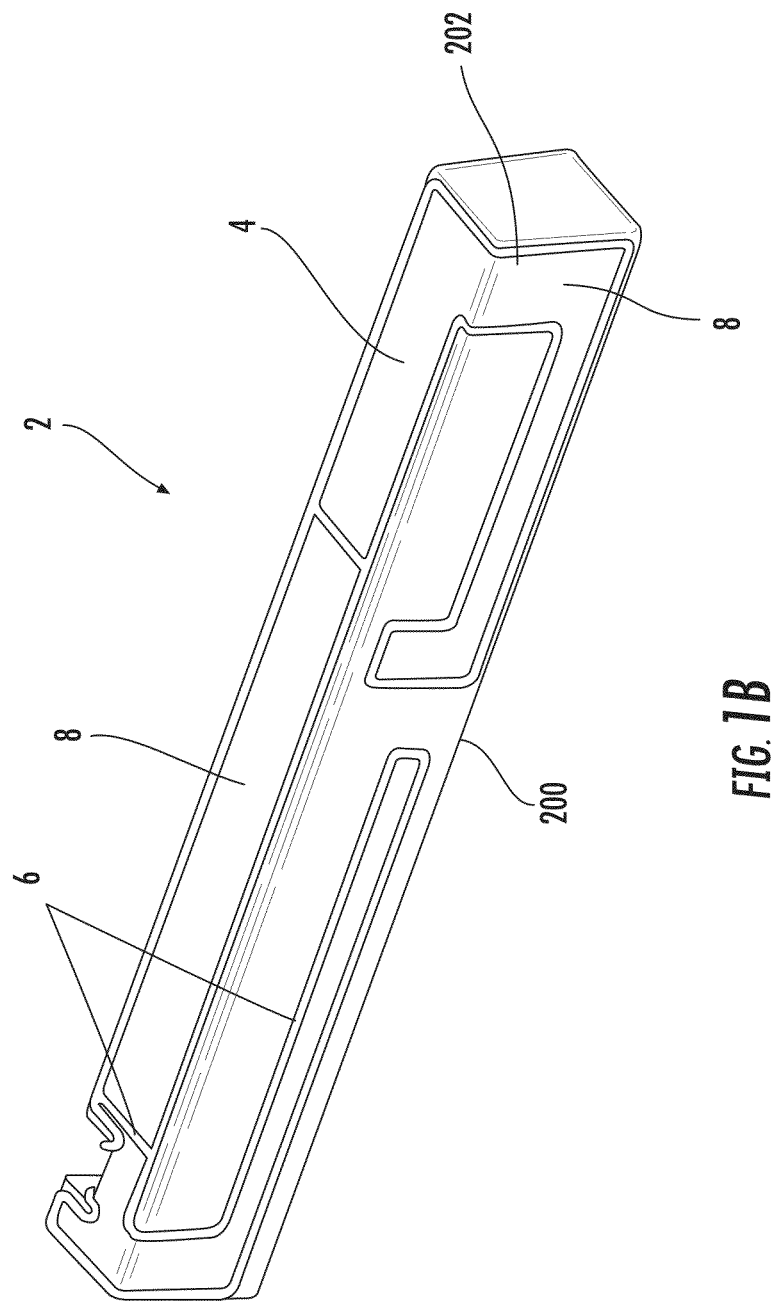
FIG. 1B is an exemplary embodiment of an article of manufacture 2 including a non-planar antenna 6 according to the present disclosure.

FIGS. 1A and 1B each depict examples of an article of manufacture 2 according to the present disclosure. In some embodiments, the article of manufacture 2 forms a portion or all of a housing for a mobile device such as a cellular phone, a PDA (personal data assistant), a smartphone, or a tablet to name a few examples. In some embodiments, the article of manufacture includes a conductive element, such as an antenna structure, to be combined with or used as part of a mobile device.

Each exemplary article of manufacture 2 includes a base substrate 4 and an antenna 6 formed thereon. Various embodiments of the antenna 6 can be planar, such as in the variant depicted in FIG. 1A, and/or non-planar as in the variant depicted in FIG. 1B. A non-planar antenna 6 may span various surfaces 8 that are non-planar, such as mutually orthogonal surfaces 8. The surfaces 8 depicted in FIG. 1B are mutually non-coplanar. In other embodiments, the antenna 6 may span two, three, four, or more mutually non-coplanar surfaces 8. In yet other embodiments, the antenna 6 may be formed upon one or more curved (non-planar) surfaces. Various other combinations of the foregoing, and/or other configurations, will be recognized by those of ordinary skill in the art given the present disclosure.

In one implementation, the conductive trace (e.g., antenna 6) is dispensed in multiple (e.g., three) dimensions using a fluid dispensing head having at least one nozzle that moves over the substrate 4. As the nozzle moves over the substrate 4, individual droplets of a conductive ink are ejected onto the substrate 4 in order to define portions of the antenna 6. This process can advantageously generate a "thick" conductive antenna trace 10 in several strokes or passes of the nozzle or, in some cases, in a single stroke or pass of the nozzle over the surface of the substrate 4. The resulting trace can be several times (or more) the thickness of the "skin depth" δ for the trace material for a given operating frequency.

Skin depth δ is related to a formula describing how current density varies with depth in a conductor under the influence of an external alternating current field. The formula for current density is shown in Eqn. (1):

$$J = J_s e^{-d/\delta} \quad \text{Eqn. (1)}$$

where J equals a current density at a given depth d into the trace, and $J_s$ equals the current density at the surface of the trace. The value d equals a distance d measured from the outer surface of a conductive body along a direction that is perpendicular to the outer surface. A typical operating frequency is 1 GHz (gigahertz), although it will be appreciated that this value is merely exemplary (and in no way limiting of any operation parameter of the trace), and other values may be readily substituted. In some cases in which a material is a composite between conductors and insulators we may refer to the skin depth as an "effective skin" depth that is based on material performance. The skin depth δ at a given frequency is defined as the depth into the conductive body at which the current density J has fallen by about 63%, or to 1/e of the value at the surface. See, e.g., John R. Reitz, Frederick J. Milford, and Robert W. Christy, "FOUNDATIONS OF ELECTROMAGNETIC THEORY," Third Edition, published in 1980 by Addison-Wesley Publishing Company, incorporated herein by reference in its entirety (see e.g., p. 369). The authors of this book included. The general formula for skin depth of a given material is shown in Eqn. (2):

$$\delta = [2/\omega\mu\sigma]^{1/2} \quad \text{Eqn. (2)}$$

wherein ω equals the angular frequency of incoming radiation, μ equals the magnetic permeability of the material, and σ equals the conductivity of the material. In the estimates that follow the contribution of μ is ignored because it tends to be a constant for typical materials used like silver. For purposes of discussion the value of ω can be equal to 2π times the frequency of 1 GHz.

Each trace of the exemplary embodiment of the antenna (antenna 6) is formed from a conductive fluid that contains particles of a metal. Preferably, the metal has a high conductivity. Silver is one example of such a metal useful with this disclosure. Solid silver metal has a skin depth that is about 2

μm measured at 1 GHz. Traces formed from the conductive fluid will generally tend to have lower conductivity than that of bulk silver, at least partly because the particles tend to have low surface area contact with each other and are not perfectly compacted together.

For purposes of the present discussion, it is noted that a relationship can be defined between the skin depth of a printed trace formed from particles of a given metal versus the bulk metal itself. The formula is shown below in Eqn. (3):

$$\delta_{trace} = \delta_{bulk} * \sigma^{1/2}_{bulk} / \sigma^{1/2}_{trace} \qquad \text{Eqn. (3)}$$

In the above relationship, $\delta_{trace}$ is the skin depth of the trace, $\delta_{bulk}$ is the skin depth of the bulk metal, $\sigma^{1/2}_{bulk}$ is the square root of the bulk conductivity, and $\sigma^{1/2}_{trace}$ is the square root of the trace conductivity. This relationship states that the skin depth δ is inversely proportional to the square root of the conductivity. Note that this relationship generally only holds if the trace particles are the same metal as the "bulk" metal.

Consider an example of silver particles used to make traces. Suppose that the conductivity of the bulk silver is 25 times that of the (particle-based) trace. The skin depth ratio in this example will be about $25^{1/2}$ or about 5 to one. Since bulk silver has a skin depth of about 2 microns, the skin depth of the trace will therefore be on the order of 10 microns (five times that of the bulk material).

Note that the above comparison does not necessarily hold true for comparing traces versus bulk metal for different metals. For example, the formula is generally not accurate for comparison of bulk silver to traces formed from iron particles. This is because the two different metals have different magnetic permeability (μ) values which would then become a factor in comparing skin depths. The above ratios assume the same magnetic permeability, and that the magnetic permeability is not a dominating factor in comparing bulk metal properties to trace properties for a given metal.

The nozzle dispenses the antenna 6 using in one exemplary implementation a vector process, as opposed to "area" processes that have been employed according to the prior art. A typical vector process only affects the specific "path" defined by forming the conductive trace or bead, and leaves the remaining area of the substrate 4 unaffected (i.e., relative to a subtractive process such as LDS), except for certain processes such as curing or drying. The nozzle therefore moves along a path that defines the shape of each portion of an antenna. Notwithstanding, some aspects of the present disclosure may be utilized consistent with or in conjunction with area-based processes if desired.

FIGS. 2, 2A, and 2B depict an exemplary portion or trace 10 of an antenna 6. The trace 10 may also be referred to as a "trace segment" or "trace portion." Trace 10 has a length L, width W, and thickness t. In one embodiment, the width W can range between 0.15 to 3.0 mm (millimeters). More particularly, the width W in an exemplary implementation falls between 0.3 to 2.0 mm. In another implementation, W falls between 0.5 and 1.5 mm. In yet another implementation, W falls between about 0.6 to 1.4 mm. Yet other values for W may be substituted, as will be recognized by those of ordinary skill when provided the present disclosure.

The selection of a trace width W is in the exemplary embodiment based upon such considerations as impedance, the presence or possibility of voids or other defects, and trace density. As the trace width decreases below a certain value (e.g., 0.5 mm in one particular case), an ability to form the trace based on a particular nozzle design can become increasingly challenging, due to, inter alia, the resolution of the drop generator. Also a void in the trace (caused by, for example, and air bubble) of a given size is going to have a much greater impact on a narrower trace. A void may also provide an electrical constriction in the trace. Resistance at the constriction may be unacceptable. On the other hand, as the trace becomes wider, it may require more dispensing operations and trace geometry becomes constrained for higher density designs. Yet other factors or considerations may be important to the determination of optimal or desired trace width.

FIG. 2A depicts a cross section of a trace 10 formed on a substrate 4 taken through section AA. In an exemplary embodiment, the trace thickness t is in a range of 20 to 100 μm (microns or micrometers). In another implementation, the trace thickness t falls in the range of 30 to 70 μm. In yet another implementation, the trace thickness t falls in the range of 40 to 60 microns. In yet another implementation, the trace thickness t falls in a range of 20 to 50 microns. In yet another implementation, the trace thickness t falls in a range of 30 to 40 microns. Other values within the various ranges aforementioned, or yet other ranges, may be used as well consistent with the present disclosure.

In one exemplary embodiment of the present disclosure, any or all of these thickness can be formed with a single stroke or pass of a dispensing head nozzle across a substrate surface, including composites of the foregoing (e.g., a first portion at thickness $t_1$ and width $W_1$, a second portion at thickness $t_2$ and $W_2$, and so forth, each of the portions in sequential order). In one embodiment, a single stroke of the dispensing head nozzle over the substrate 4 can form a trace 10 having a thickness t within a range of 30 to 50 microns. In another embodiment, a single stroke of the dispensing head over the substrate 4 can form a trace 10 having a thickness t within a range of e.g., 30 to 40 microns.

As started earlier, it is preferable in some implementations that the thickness t be at least a prescribed multiple (e.g., at least twice or at least three times) a skin depth δ for a given trace 10. In an exemplary embodiment, the trace 10 depicted in FIG. 2A has a skin depth δ in the range of in the range of 4 to 15 μm (microns or micrometers) at 1 GHz. In some implementations, the trace 10 has a skin depth in a range of 8 to 15 μm. In some implementations, the trace 10 has a skin depth in a range of 10 to 13 μm. It will be appreciated that in referring to the skin depth of a particular implementation described herein, the terms "skin depth" and "effective skin depth" are to be considered to be interchangeable. This is largely due to the fact that the trace 10 is essentially a composite material, as will be explained in greater detail below.

As stated earlier, it is preferable in some implementations that the thickness t be at least a given multiple (e.g., 4 or 5 times) a skin depth δ for a given trace 10. In an exemplary embodiment, the trace 10 depicted in FIG. 2A has a skin depth δ in the range of 4 to 10 μm (microns or micrometers) at 1 GHz. In another implementation, the trace 10 has a skin depth δ in the range of 4 to 8 μm. In yet another implementation, the trace 10 has a skin depth δ in the range of 4 to 6 μm (e.g., about 5 μm). Skin depths in these ranges are based on, inter alia, materials used to form trace 10. For instance, skin depth may be largely determined by the dry composite structure of the trace including such factors as particle size, particle spacing, orientation, and matrix material that exists between the particles. To a secondary extent, it is determined by the (e.g., silver) particle material properties, since the matrix material may have different impedance or other properties than that of the silver particles. It will be appreciated that one salient advantage of the present disclosure relates to enablement of a single "stroke" of the nozzle to produce a multiple of the skin depths, such that single nozzle pass printing of a fully functional conductive trace (e.g., antenna) is enabled.

Also, it will be appreciated that the skin depth δ may vary along the length of the trace 10 if material variations are present within the conductive trace 10. A certain degree of material variations may be present in a particular conductive fluid. Also there may be a desire to dispense more than one type of conductive fluid along the length of trace 10.

FIG. 2B depicts a cross section of a trace 10 formed on the substrate 4 taken through section BB. Trace 10 is formed from a plurality of conductive particles 12. The particle materials and microstructure are at least partly determinative of the "effective skin depth" δ of trace 10. Each of the particles have a characteristic particle dimension $D_p$, which may vary from particle to particle. The effective skin depth δ of trace 10 can be at least partly determined by a number of different factors including particle 12 dimensions, the percentage by weight of particles 12 of trace 10, particle 12 orientation, the electrical properties of matrix 13 between particles 12, electrical properties of particle 12 material, and other factors. In an exemplary embodiment matrix 13 has a much higher resistivity than particles 12, so that the density and geometric arrangement of particles 12 within a less conductive matrix material 13 may dominate in determining an effective skin depth δ.

In an exemplary embodiment, the particles 12 comprise silver particles. In other embodiments, the particles 12 can be formed from copper, aluminum, gold, or platinum, or any other high conductivity metal, or even alloys thereof. Moreover, the particles may be mixed with other (heterogeneous) particles, such as where silver particles and gold particles are mixed in a desired proportion (contrast, alloyed together).

In an exemplary embodiment, the particles 12 are substantially flattened, irregular-shaped particles such as "flakes". Top and side views of an exemplary silver flake are depicted in FIGS. 2C and 2D, respectively. The top view in FIG. 2C depicts an irregular outline having a major dimension D. The side view in FIG. 2D depicts thickness A of the flake. Other shapes may be used consistent with the present disclosure, where it is determined that such shape(s) provide the desired properties and performance.

It will also be appreciated that one or more of the particle characteristics (such as e.g., D, A above) may be statistically distributed according to a function; e.g., a Gaussian or "normal" distribution, or other such function. For instance, most particles may fall within a given parametric range, with lesser portions of the whole falling within other ranges. In an exemplary embodiment, at least 95 percent by weight of the particles 12 have a dimension D that is less than 20 μm. In one particular implementation, at least 95 percent by weight of particles 12 have a dimension D that is less than 16 μm. It can be advantageous in certain cases to have a majority of particles (by weight) having a value of D that is e.g., larger than about 4 microns, larger than about 6 microns, larger than about 8 microns, or larger than about 10 microns. However, particles 12 having a major dimension D larger than about 20 μm are sometimes difficult to nozzle dispense for a selected practical range of dispense nozzle sizes. It is also noted that particles having a flake-like or plate-like or oblate (flattened sphere) form factor can provide advantages of a larger dimension D while being more amenable to dispensing. Hence, the present disclosure recognizes that particle shape, among other things, can be a significant determinant of performance, and in fact can be controlled to achieve one or more desired properties or characteristics such as e.g., reduced nozzle clogging, enhanced flow, better pattern consistency, etc.

In some embodiments, at least 95 percent by weight of the particles 12 have a major dimension D that is in a range of 2 μm to 20 μm. In some embodiments, at least 95 percent by weight of the particles 12 have a major axis D that is in a range of 6 μm to 16 μm. In yet other embodiments, at least 95 percent by weight of the particles 12 have a major axis D that is in a range of 10 μm to 12 μm.

In an exemplary embodiment, the minor dimension A (thickness of particle 12) is in the range of 0.3 to 4.0 μm for the majority of particles by weight. In another implementation, A is in the range of 0.5 to 2.0 μm for the majority of particles by weight. In yet another implementation, A is in the range of 0.5 to 1.0 micron, or even in the range of 1.0 to 2.0 micron for the majority of particles by weight. For instance, one particular embodiment uses particles having A on the order of 0.6 micron for the majority of particles by weight.

It will be appreciated that the foregoing dimensions (e.g., major and/or minor axis length) can be distributed according to other paradigms or functions (i.e., other than a 95% or "majority standard). For example, in one variant, the particle major/minor dimension is/are distributed according to a Gaussian function (e.g., with most particles centered on a nominal dimension, and lesser numbers of particles distributed at varying values above and below nominal). Yet other types of distributions or functions can be used consistent with the disclosed conductive fluid, and functions can even be mixed (e.g., Gaussian for the major axis, another distribution for the minor axis).

The form factor of particles 12 can be defined by any number of metrics, such as the ratio of D (the major dimension) to A (the minor dimension or thickness). In an exemplary embodiment, the ratio of D to A is more than 2 for the majority of the particles by weight. In another implementation, the ratio of D to A is more than 4 for the majority of the particles by weight. In yet another implementation, the ratio of D to A is more than 8 for the majority of the particles by weight.

It has been observed that in certain cases, when the conductive trace 10 is dispensed and cured, a fraction of the particles 12 often tend to align themselves along an outside surface 14 of the trace 10, whereby the major axis D of a particle 12 is in at least partial alignment with the outside surface 14. Of course there is some degree of random orientation, but it has been noted by the inventors hereof that such alignment tends to occur particularly for particles 12 having a longer major axis D. Also the particles 12 disposed away from the outside surface 14 appear to tend to have more of a random orientation.

Figures 2F, 2G:
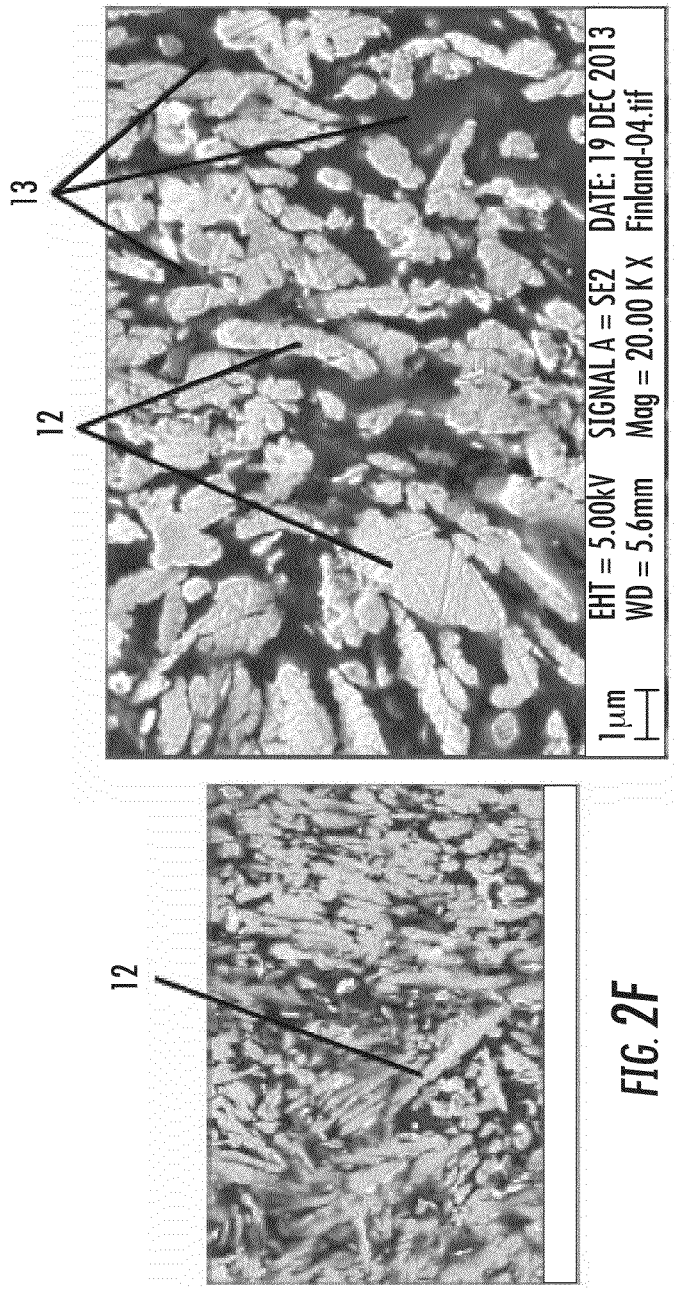
FIG. 2F is a SEM photograph of a cross-section of a conductive trace showing "typical" conductive silver flakes.
FIG. 2G is a SEM photograph of a cross-section of a conductive trace showing a highly magnified view of conductive silver flakes.

FIGS. 2E, 2F, and 2G are SEM (scanning electron microscopy) photographs of a cross section of An exemplary trace 10 illustrating several silver flake particles 12 within less conductive matrix material 13. The SEM photograph depicts the particles as perhaps having a large distribution of sizes, although the size distribution illustrated may be at least partly a result of variations in orientation of the particles relative to a plane of a cross section. The trace as shown in section 2E is approximately 50 μm in thickness t. Individual particles 12 typically have a major dimensions D of about 3-15 μm and thickness A of about 0.5 to 1.0 μm in this exemplary case, although it will be appreciated that other values may be utilized.

Figure 3:
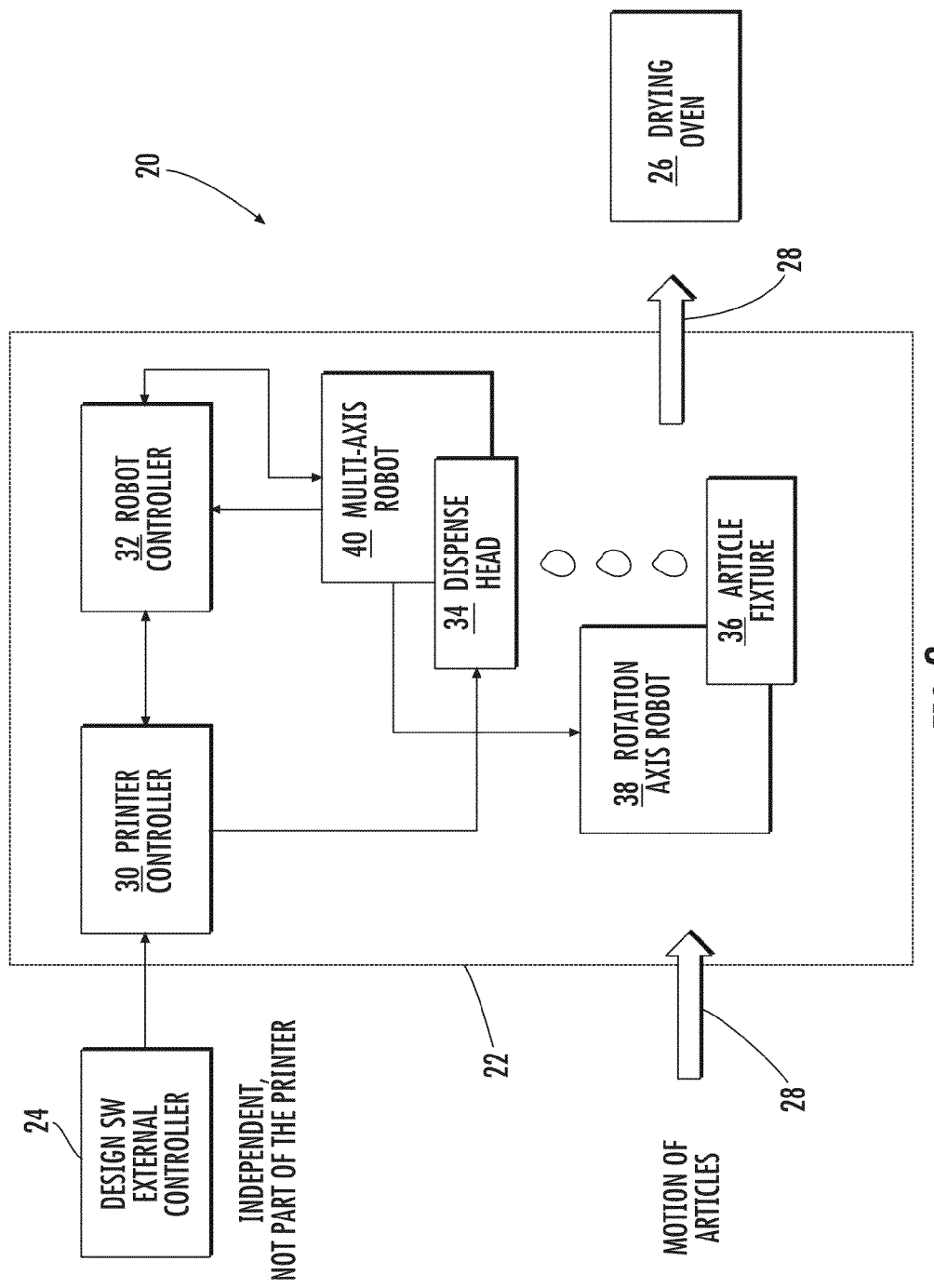
FIG. 3 is a block diagram of one embodiment of an exemplary manufacturing system for forming an antenna on an article of manufacture.

FIG. 3 is a block diagram representation of an exemplary embodiment of a manufacturing system 20 for forming one or more traces 10 on one or more substrates 4. The manufacturing system 20 includes a printing system 22 under control of a computer 24 and a curing apparatus (e.g., drying oven) 26. As indicated by arrows 28, an article of manufacture 2 is transported to the printing system 22, at which the trace(s) 10 are dispensed, and then to the curing/drying apparatus 26. Transportation according to arrows 28 may be via any appropriate method such as movable pallets or a conveyor belt, pick and place machine, by hand, or yet other means.

In one implementation, an industrial controller 30 is electrically and/or wirelessly coupled to a controller 24 (e.g., external controller), robot controller 32, and dispense head 34. The industrial controller 30 receives instructions from the controller 24, and in turn controls the operation of the robot controller 32 and dispense head 34. The robot controller 32 controls motion of article fixture 36 and dispense head 34 by controlling rotation axis robot 38 and multi-axis robot 40 respectively. A cooperative or synchronized motion control moves the dispense head 34 over the article 2 (which may include multiple articles arranged in a desired disposition, such as series, parallel, array, etc.) that is mounted in the article fixture 36 to enable formation of traces 10.

As the dispense head 34 is moved across the article 2, the controller 30 controls the dispense head 34 to generate and eject droplets of a conductive fluid to form patterns defining one or more traces 10. Once the patterns are formed, the traces 10 are as yet in an uncured state. The article of manufacture is then transported to the cure apparatus 26 where in one embodiment, solvent in the conductive fluid is dried, and conductive particles 12 become coalesced (and in some cases bonded together) to form the final shape/consistency of the trace(s) 10.

As a note, the term "conductive fluid" as used herein refers without limitation to a fluid medium, such as an organic solvent or other carrier, that contains conductive particles. Upon dispensing, the bulk conductivity of the fluid may not be very high initially. However, once the traces 10 are fully formed from the fluid (including curing), the traces are electrically conductive enough to provide an effective conductive pathway, such as an antenna for a mobile wireless device.

Figure 4A:
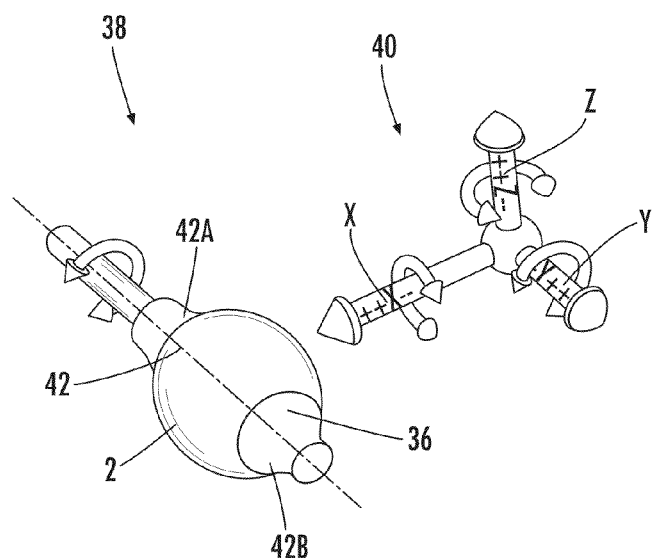
FIG. 4A is a schematic representation of a first embodiment of a motion control portion of a printing system that forms part of a manufacturing system.
Figure 4B:
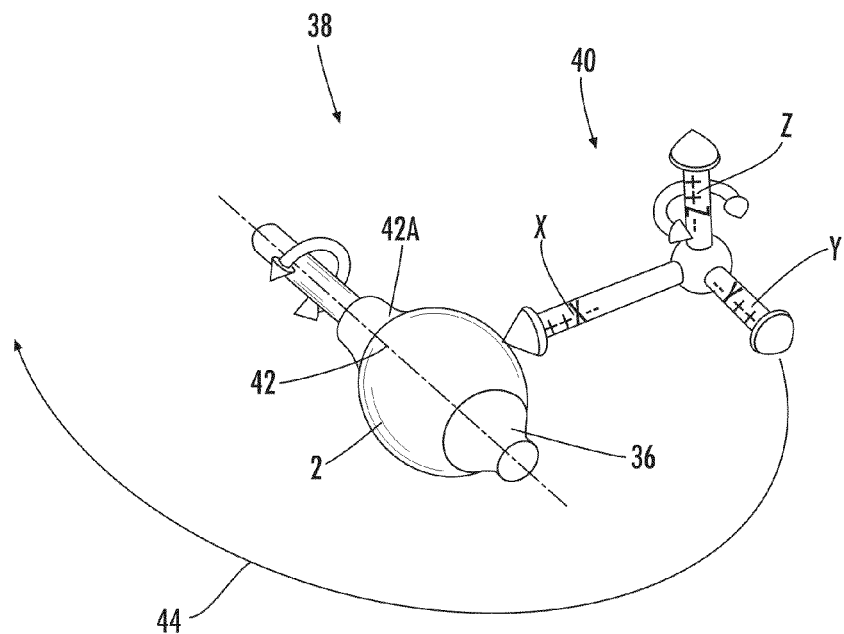
FIG. 4B is a schematic representation of a second embodiment of a motion control portion of a printing system that forms part of a manufacturing system.

FIGS. 4A and 4B depict embodiments of a motion control portion of the printing system 22 which includes a rotation robot 38 and multi-axis robot 40. For each embodiment, the robot controller 32 controls the cooperative motion of both robots 38 and 40. In a first embodiment, the robot controller 30 can halt the rotation axis robot 38 while the multi-axis robot 40 moves the dispense head 38 over the article 2 during a dispensing operation that forms the trace(s) 10. Thus, in this first embodiment, the conductive trace (e.g., antenna 6) is formed through a series of alternating motions of the rotation axis robot and multi-axis robot under control of the robot controller 30.

In a second embodiment, the robot controller continuously controls simultaneous synchronized cooperative motion of the rotation axis robot 38 and the multi-axis robot 40 to form traces 10. This second embodiment has an advantage of potentially a shorter cycle time for dispensing the trace(s) 10. A third embodiment is in effect a combination of the first embodiment and the second embodiment, whereby for some traces, the robots 38 and 40 move continuously in cooperation, and for some traces the robot 38 is halted while the robot 40 moves during a dispensing operation.

Referring to FIG. 4A, the rotation axis robot 38 supports the article fixture 36 at two ends of article fixture 36 along an axis 42. Thus the fixture 36 is supported at a first end 42A and a second end 42B arranged along an axis 42. Rotation axis robot 38 rotates the article fixture about the axis 42 to allow the dispense head 34 to obtain access to different surfaces of the article 2. Multi-axis robot 40 is in the exemplary implementation a six-axis robot that can translate along linear axes X, Y and Z, as well as rotate about axes X,Y and Z.

Referring to FIG. 4B, the rotation axis robot 38 supports the article fixture 36 at a single end 42A of the article fixture 36 along an axis 42. Rotation axis robot 38 rotates the article fixture about the axis 42. Because the article fixture 36 is supported at only one end, the multi-axis robot on this case can be rotationally translated around the fixture 36 as indicated by arc-shaped arrow 44. Multi-axis robot 40 is a four axis robot that can translate along linear axes X, Y and Z and rotates relative to the Z-axis along the indicated path 44.

Figure 4C:
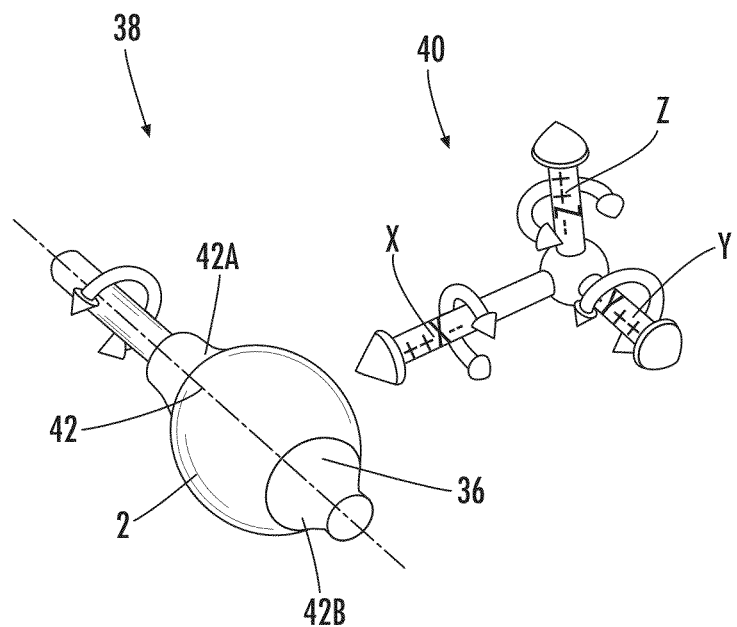
FIG. 4C is a schematic representation of a third embodiment of a motion control portion of a printing system that forms part of a manufacturing system.

Referring to FIG. 4C, the rotation axis robot 38 supports article fixture 36 at two ends of article fixture 36 along an axis 42. Thus fixture 36 is supported at a first end 42A and a second end 42B arranged along axis 42. Rotation axis robot 38 rotates article fixture about axis 42 to allow dispense head 34 to obtain access to different surfaces of article 2. Multi-axis robot 40 is a three axis robot that can translate along linear axes X, Y and Z.

In an exemplary embodiment, a positional accuracy provided by robots 38 and 40 is to within about plus or minus 0.1 millimeter. This accuracy is maintained along the X, Y, and Z axes, although it will be appreciated that other values can be used (whether for all three axes, or individually, such as where heterogeneous values are used for two or more of the axes).

Figure 5:
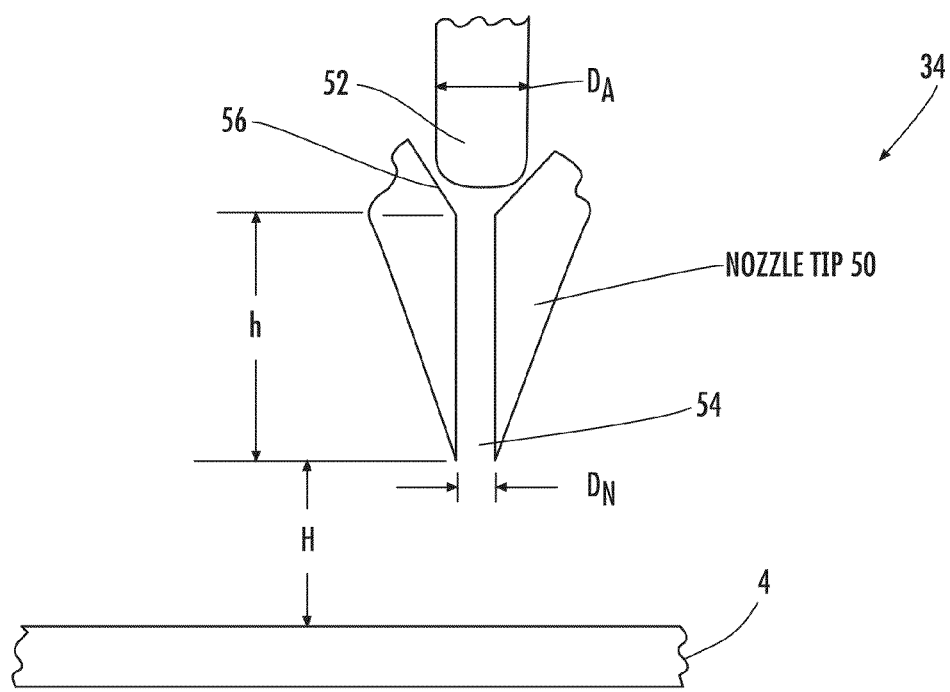
FIG. 5 is an exemplary embodiment of a portion of a dispense head.

FIG. 5 is an exemplary embodiment of a portion of the dispense head 34. FIG. 5 is a cross sectional schematic of the head 34 showing details for a single nozzle tip 50 that in this implementation is driven by a piezoelectric hammer 52. The tip of the hammer 52 displaces vertically under the force of a piezoelectric "pusher" transducer and, with each oscillation, ejects a droplet of conductive fluid from nozzle opening 54. As a note, the term "vertical" used in this context does not refer to any gravitational reference but refers to the FIG. 5 illustration and a general direction that droplets of conductive fluid may be ejected onto substrate 4 from the nozzle 54. In fact, this direction may even be horizontal or obliquely inclined relative to a gravitational or any other frame of reference.

The use of a piezo pusher based "drop on demand" dispense head can have certain advantages. "Drop on demand" generally refers to an ability to programmably eject a prescribed number of (e.g., one) droplet(s) at a time at a range of desired drop ejection frequencies, drop sizes, and numbers of drops in a burst of drops.

In an exemplary embodiment, the nozzle opening 54 has a diameter $D_N$ in the range of 50 to 300 μm. In one implementation, the diameter $D_N$ is in a range of 70 to 200 μm. In yet another implementation, $D_N$ is in a range of 80 to 120 μm; e.g., about 100 μm. In an exemplary embodiment, the height H of the nozzle opening can be 0.5 mm to 5 mm (mm=millimeters or thousandths of a meter). In one particular exemplary implementation, h is about 3 mm.

In one embodiment, the head 34 is configured to control the temperature of (e.g., add heat to) the conductive fluid. In one variant, the conductive fluid is heated to a temperature within a range of 30 to 80 degrees Celsius. In another embodiment, the conductive fluid is heated to a temperature within a range of 40 to 70 degrees Celsius. In yet another embodiment, the conductive fluid is heated to a temperature within a range of 50 to 60 degrees Celsius. The temperature can further be modulated if desired in order to, inter alia, control the performance of printhead 34. For instance, one aspect of performance relates to the viscosity of ejected ink, which generally tends to decrease with rising temperature.

As depicted in FIG. 5, there can be a tapered entrance section 56 leading in to the nozzle opening 54. The piezo hammer 52 impacts the tapered section 56 vertically. In an exemplary embodiment, the piezo hammer 52 has a diameter $D_A$ that is in the range of 0.7 to 2.0 mm. In one implementation, diameter $D_A$ is about 1.5 mm. In one embodiment, the amplitude of oscillation of piezo hammer 52 is in the range of 0.1 to 0.5 mm; e.g., 0.3 mm. The dimensions thus described have been found to be advantageous in dispensing a conductive fluid as described in this detailed description which has particles in which 95% of the conductive flakes have a major dimension that is less than 20 μm, although it will be readily appreciated that other sizes and/or dimensions may be used consistent with the present disclosure.

In an exemplary embodiment, the nozzle 54 is positioned with a height H that is less than 2 mm above the substrate 4, but more than 0.1 mm. More particularly, in one implementation, H is less than 1 mm but more than about 0.2 mm. In another implementation, H is in the range of 0.4 mm to 1.0 mm. In another exemplary embodiment, H is about 1 mm.

When drops are ejected from the nozzle 54, there can be trajectory errors introduced due to drops that are ejected at some angle from the nozzle 54. Other sources of trajectory errors include airflow and a translation velocity between the nozzle 54 and the substrate 4 parallel to the substrate 4. This translation velocity introduces a velocity component to ejected droplets of fluid that is not normal to the receiving surface of substrate 4. It is possible to compensate for this component through, e.g., drop ejection timing, but such compensation may introduce errors. One way to improve drop placement accuracy is to minimize H. But at the same time, a value of H that is too small may cause a "collision" between the nozzle top 50 and the substrate 4 which could result in damage to the dispense head 34 or to a resultant article of manufacture 2. Thus, it has been found by the inventors hereof that the discussed ranges for H are typically optimal for dispensing conductive fluid for conductive elements such as e.g., antennas.

A control system within the printing system 20 maintains the distance H to a consistent value while drops of conductive fluid are being dispensed upon the substrate 4. This is despite sometimes having to move the nozzle 54 over a three-dimensional surface of a substrate 4. While moving along a straight or curved path, the stroke nozzle 54 dispenses drops in a manner such that individual dots may be difficult to discern despite the use of large drops of conductive fluid. As defined herein, a stroke is the motion of a nozzle 54 relative to a substrate 4 during the formation of a trace 10 of antenna 6. The stroke can be linear or nonlinear in shape and/or rate of motion. A stroke can be executed over a non-planar path such that a plane cannot be fitted to the path of the stroke due to a non-planar substrate surface 4.

In an exemplary embodiment, the dispense head 34 described above can form dots on a substrate having a dry volume of each dot (after solvent is dried) in the range of e.g., 1000 to 10000 picoliter (one picoliter is $10^{-12}$ liter). In a more particular embodiment, the dry volume of each dot is in the range of 2000 to 5000 picoliter. In one implementation, the dry volume of each dot is in the range of 2500 to 4500 picoliter. In yet another implementation, the dry volume of each dot is in the range of 3000 to 4000 picoliter, e.g., about 3500 picoliter. Having drop volumes within these ranges can enable the rapid production of exemplary antenna traces while avoiding drop-induced variations in trace impedance that might occur if the drops are too large.

In some embodiments, the dispense head 34 can form dots on a substrate, each dot having a dry volume in the range of 500 to 5000 picoliter. In some embodiments, the dispense head 34 can form dots on a substrate having a dry volume of each dot in the range of 1000 to 2000 picoliter. In yet other embodiments, the dispense head 34 can form dots on a substrate having a dry volume of about 1600 picoliter.

In an exemplary embodiment, the dispense head 34 described above with respect to FIG. 5 can dispense drops that form dots on a substrate having dot diameters within the range of 100 to 1000 μm. In one implementation, the dot diameters are within a range of 200 to 600 μm. In yet another implementation, the dot diameters are in a range of 300 to 500 μm, or in a range of 350 to 450 μm. The particular selected dot size generally depends upon a dimension of the narrowest trace width W desired, although other considerations may be used in selecting appropriate drop size.

Figure 6:
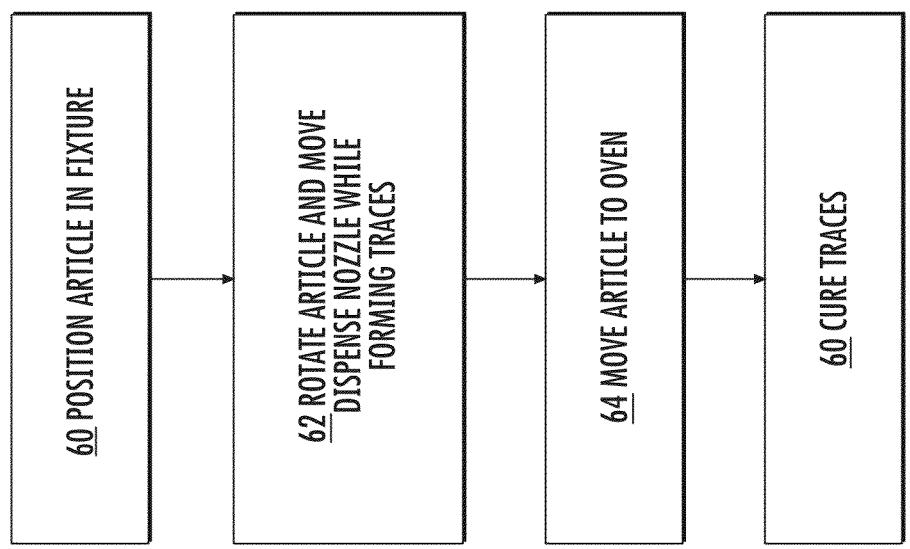
FIG. 6 is a flowchart representation of an exemplary embodiment of a process for fabricating an antenna.

An exemplary embodiment of a method for manufacturing an article 2 with a conductive element (e.g., antenna 6) is depicted in FIG. 6 in flowchart form. According to step 60, the article 2 is positioned in the article fixture 36. In some embodiments it can be held by an electrically, mechanically, or pneumatically actuated grip that forms a portion of the article fixture 36. According to step 62, the article 2 is rotated, the nozzle 54 is translated across the surface of substrate 4, and drops of conductive fluid are dispensed upon the substrate 4 in order to define the antenna 6. According to step 64, the article 2 is transported to a curing apparatus (e.g., drying oven 26). According to step 66, the article 2 is dried in the oven 26 to drive solvent from the conductive fluid, and/or provide other desired effects. In an exemplary embodiment, the baking cycle is for 10-60 minutes with a temperature in the range of 90 to 140 degrees Celsius. In one implementation, the oven temperature can be in the range of 100 to 130 degrees Celsius. In one particular embodiment, the baking cycle is about 25 minutes with a temperature of 100 to 110 degrees Celsius. In one embodiment, the oven 26 comprises a zone oven having varying zone temperatures to enable one or more desired drying temperature profiles. With such an embodiment, step 66 includes the translation of the article 2 on a belt through the various temperature zones.

Figure 7:
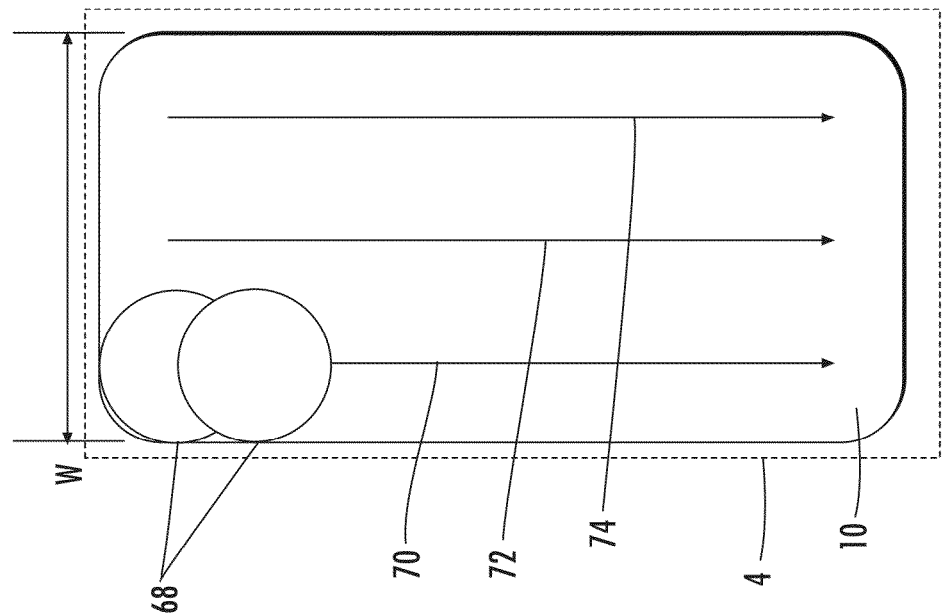
FIG. 7 is an illustrative embodiment of a three-pass formation of a conductive trace.
Figure 8:
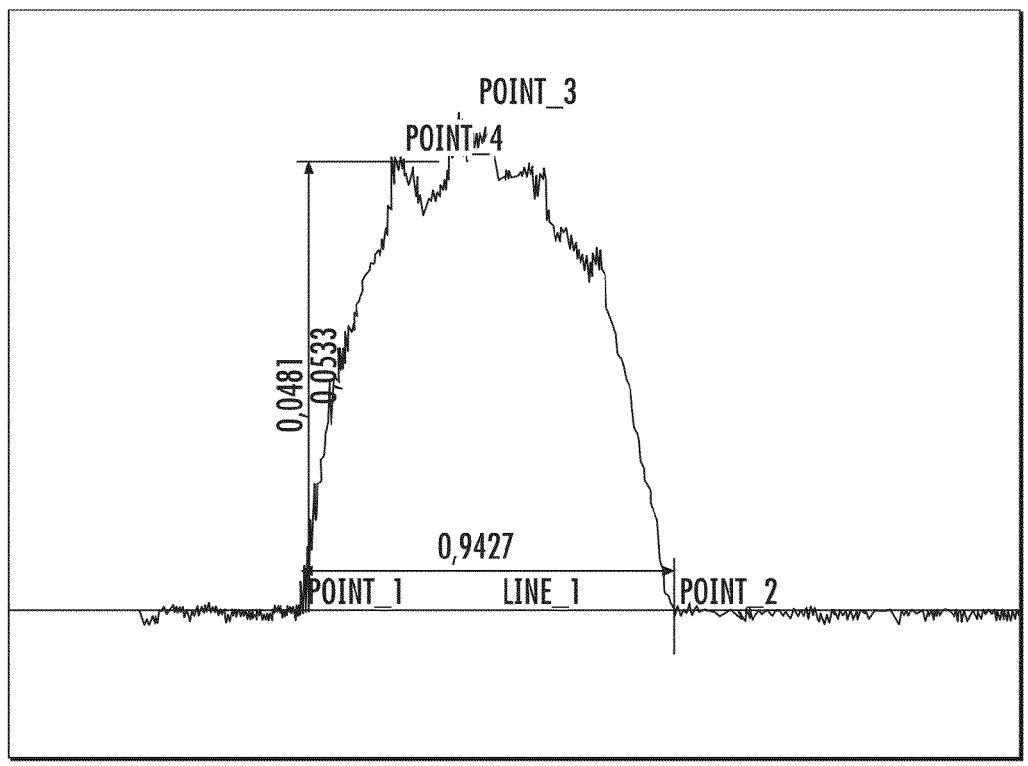
FIG. 8 is a profile of an exemplary conductive trace that is about 1 millimeter wide and about 50 micrometers thick.

The desired width W of a trace 10 can be generally be obtained with one or more strokes or "path segments." FIG. 7 depicts an exemplary three-stroke manner of dispensing a trace 10 having a width W of about 1 mm by ejecting a sequence of dots 68. During a first stroke or "path segment" 70 of the nozzle along the substrate 4, a series of dots 68 are formed on a surface of the substrate 4. Each dot is about 350 to 450 μm in diameter. A second path segment 72 of the nozzle forms a second sequence of dots that is parallel and overlapping to the first path segment. A third path segment 74 forms a third sequence that is parallel and overlapping to the second. Collectively, the three path segments form a dispensed trace 10 that is approximately 1 mm wide W and 50 μm in thickness t. FIG. 8 is a measured profile of the existing trace which is about 0.9 mm wide W and has a thickness of about 50 μm. It will be appreciated that timing may also be considered during the foregoing three-stroke process; e.g., so as to make sure that a desired property of the individual strokes is maintained. For example, it may be that the three individual strokes must be laid down in close temporal order, so as to maintain sufficient "wetness" and hence blending of the material of each of the strokes. Alternatively, it may be that the second and third strokes may be delayed for a period, so as to permit a bit of "drying" and hence formation of surface tension on the drop to aid in, e.g., mechanical stability of each stroke trace so as to support the other subsequent stroke(s). It will also be appreciated that the individual strokes need not necessarily be laid down in any spatial order or sequence; e.g., they may be laid down in 1-3-2 order, 1-2-3, order, and so forth. Moreover, as discussed below, all may be laid down simultaneously.

Multiple path segments combining to form a trace 10 can be dispensed using multiple strokes of a dispense head or utilizing a dispensing head having more than one nozzle. In an alternative embodiment, the three path segments 70, 72, and 74 are formed simultaneously in a single pass using a dispense head 34 having three or more nozzles 54. The multiple nozzles 54 in such a case would enable the dispense head to vary a width of a trace according to how many nozzles are activated. Such a dispense head 34 would also greatly increase the speed of the dispensing system.

In other embodiments, the trace 10 can be formed using one, two, three or more path segments. In another exemplary embodiment a single path segment is utilized by a single nozzle to form a trace having a width W of about 400-600 μm. In yet another embodiment two path segments are utilized to form a trace having a width W of about 700 μm.

In other embodiments, the trace 10 can be formed using a single path segment and having a trace width of about 400 to 500 μm. Thus, a trace 10 can be formed that is 400 to 500 μm in a single pass or stroke. The trace thickness t can be, in one implementation, 6% or more of the trace width W. In some other implementations, the trace thickness t can be 9% or more of the trace width W. An ability to achieve high thicknesses and aspect ratios (thickness over width) is an advantage of the material and processes used to form these traces.

In a first exemplary embodiment, the substrate 4 is composed of polycarbonate (PC). In a second exemplary embodiment substrate 4 is composed of polyamide (PA). Other embodiments may use other polymers such as PVC (polyvinyl chloride) or PET (polyethylene terephthalate). In some embodiments, the polymers can be filled with glass fibers, carbon fibers, glass beads, minerals, other filler types, and/or combinations thereof to name a few examples. Other possible materials for substrate 4 include metals, glass, and composites that combine different types of materials.

The conductive fluid used to form the traces 10 onto the substrate(s) 4 includes conductive particles 12 in a fluid vehicle. Suitable fluids for forming conductive beads are known. However, as discussed earlier, the particle size and form factor are important with conductive flakes having a major dimension D less than about 20 μm preferable in certain implementations (although this number is in no way limiting).

The viscosity of the fluid can also be important in some applications. A more viscous fluid will tend to result in relatively stable drop formation and less flow of the traces after dispensing. However, lower viscosity can enable the use of smaller drops and higher drop ejection operating frequencies. The ranges of viscosities employed have been found to be advantageous and relatively optimal in rapidly forming conductive traces for e.g., antennas. In an exemplary embodiment, the viscosity of the conductive fluid is about 10 to 80 poise. In one implementation, the viscosity of the fluid is about 20 to 60 poise. In yet another implementation, the viscosity of the fluid is about 30 to 50 poise, or in the range of 35 to 45 poise. Viscosity according to these embodiments can be measured using e.g., a viscometer. Viscosities within these ranges have been measured using a cone and plate viscometer using a high shear cap at 50 RPM (revolutions per minute) at 25 degrees Celsius. The viscometer was a Wells-Brookfield Cone/Plate system provided by Brookfield Engineering Laboratories. Other approaches for viscosity determination may be used with equal success.

In some embodiments, the viscosity can be modulated according to a printhead temperature. If the printhead is heated, the viscosity may be reduced. In one embodiment, the viscosity of the conductive fluid is about 35 to 45 poise at 25 degree Celsius, but is about 15 to 20 Poise when heated to about 60 degrees Celsius in the printhead 34 just prior to drop ejection. This approach may help to increase an ejected drop volume, and can be useful for other reasons as well.

Additionally, polymers known to be mostly evaporated during the curing (e.g., oven drying) process are preferable to minimize insulative material between the conductive particles. Another component that can in some embodiments be beneficial is to include in the fluid vehicle is a component that will dissolve a thin surface of the substrate 4. This has the potential of yielding a bonding interface between the substrate 4 and conductive trace 10. As an illustrative example, consider a conductive fluid used with a polycarbonate substrate 4. Certain aromatic hydrocarbons and ketones (such as MEK—methyl ethyl ketone) are known to dissolve polycarbonate. Certain other solvents from classes of esters, amines, and alcohols can also be utilized. Of course these are only illustrative and other components can be used depending upon the substrate material used. Including a fraction of such a component can improve adhesion between the conductive fluid and the substrate.

Using the dispensing head 34 described with respect to FIG. 5 and the inks having the above-mentioned properties, traces having at least four or at least five times a skin depth $\delta$ can advantageously be deposited with a single stroke. The thickness t per stroke can be in the range of 20 to 100 microns per stroke. In one implementation, the thickness t per stroke can be 30 to 70 microns, or 40 to 60 microns. For example, a 100 μm diameter range nozzle diameter $D_N$ with a heated fluid having a viscosity (prior to heating) of about 35 to 45 poise will provide a thickness per stroke of about 40 microns. Given that the skin depth is about 5 microns at 1 Ghz, this provides a bead with about 8 times the skin depth $\delta$ with a single stroke. Of course this particular example is but one set of parameters within the ranges discussed above that enables a high performance conductive (e.g., antenna) trace to be dispensed in an efficient manner.

Figure 9:
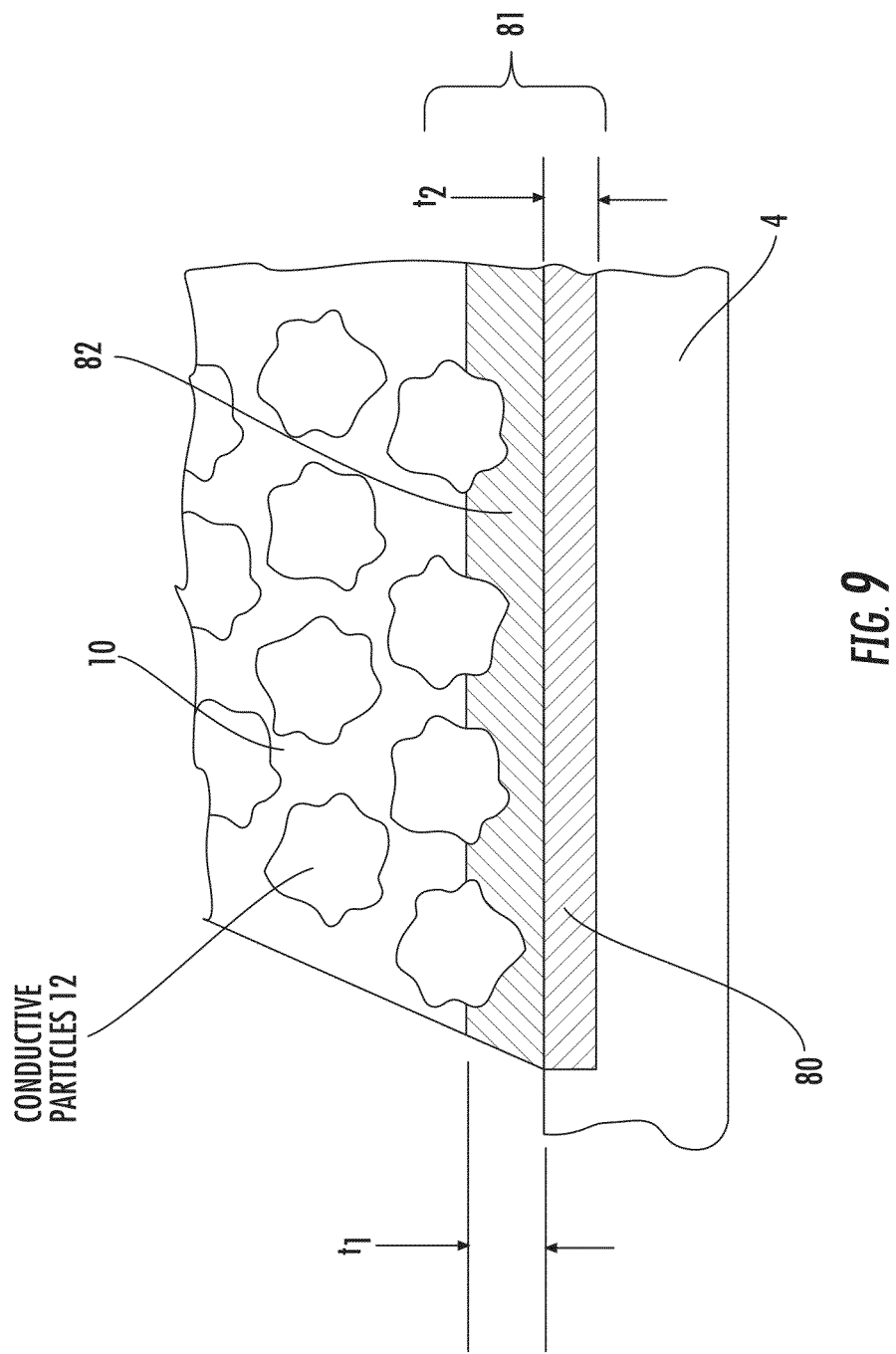
FIG. 9 is a cross sectional representation of a portion of an exemplary conductive trace formed on a substrate illustrating an adhesion zone.
Figure 10:
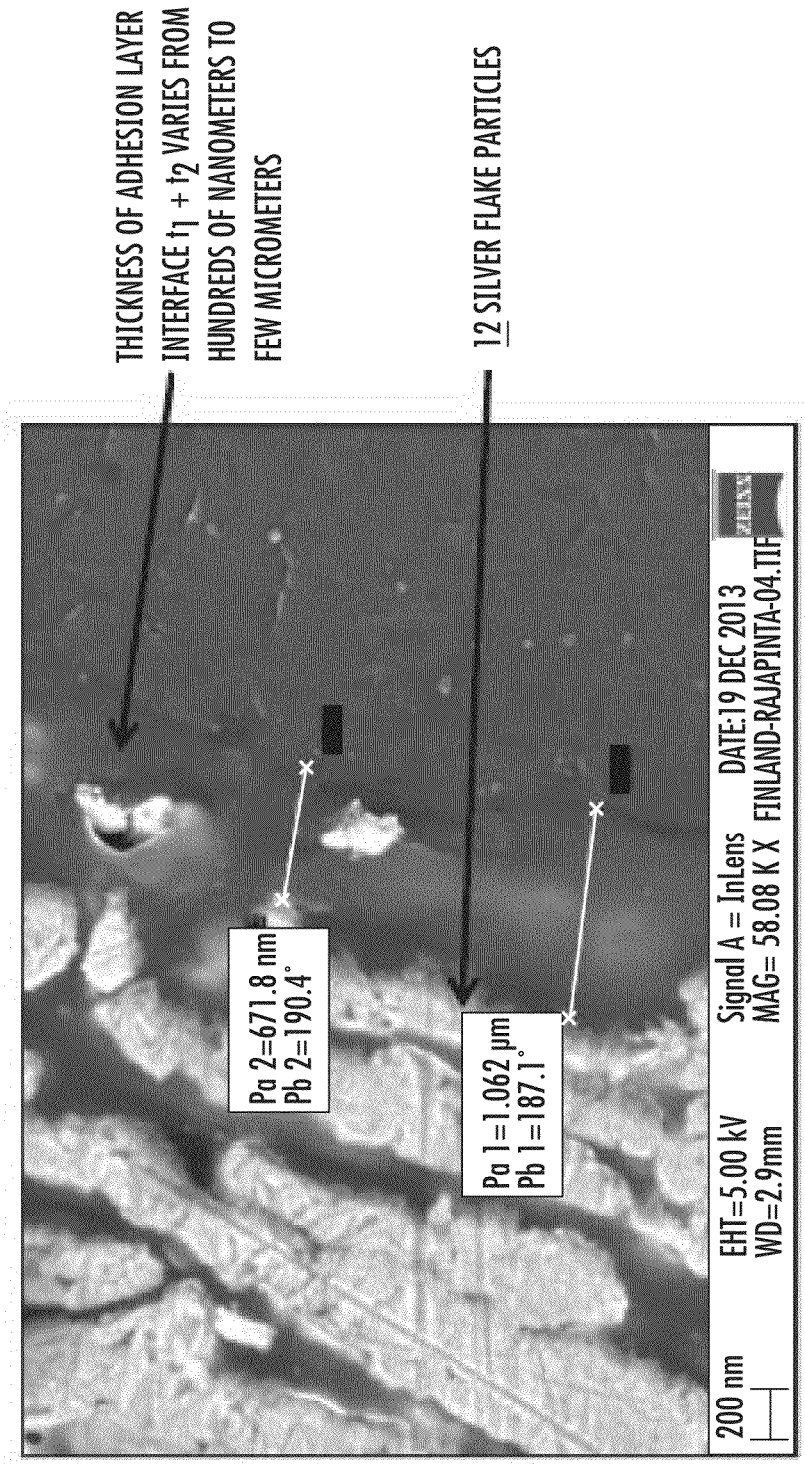
FIG. 10 is a SEM cross sectional view of a portion of an exemplary conductive trace formed on a substrate.

FIG. 9 depicts an illustrative embodiment of a bonding interface 81 between the substrate 4 and conductive trace material 10. With some substrate dissolution there is a surface adhesion effect. A portion 80 of the substrate 4 having thickness $t_2$ has been dissolved. A zone 82 within conductive particles 12 of thickness $t_1$ has been penetrated by dissolved matter from substrate 4. The overall zone of influence 81 may have a thickness $t_1+t_2$ ranging from 0.1 μm to 5 μm. In one particular embodiment, the zone of influence thickness $t_1+t_2$ can range from 0.2 to 2 microns. This can provide a mechanical lock between substrate 4 and trace 10 by through the interpenetration of substrate material up into conductive particles 12. FIG. 10 is an SEM (scanning electron microscopy) photograph of one example of such an interface.

Other bonding chemical and/or mechanical mechanisms at the interface 81 can be possible. For example, the bonding mechanism at interface may include any or all of polar, van der Waals, ionic, and/or covalent bonding. The fluid used to form trace material 10 may includes an adhesion promoter which forms a coupling agent between trace 10 and substrate 4.

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the disclosure disclosed and claimed herein.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. This description is in no way meant to be limiting, but rather should be taken as illustrative of the general principles of the disclosure. The scope of the disclosure should be determined with reference to the claims. The specific embodiments and applications thereof described above are for illustrative purposes only and do not preclude modifications and variations encompassed by the scope of the following claims.

What is claimed:

1. A method of forming an assembly having at least one conductive trace, the method implemented using an apparatus configured to eject drops of a conductive fluid comprising:
   providing a substrate upon which the at least one conductive trace is to be deposited;
   causing transport of at least a portion of the apparatus over a surface of the substrate while ejecting a plurality of conductive fluid drops to form the at least one conductive trace, each of the plurality of conductive fluid drops comprising a volume of at least 500 pL; and
   heating at least the at least one conductive trace to remove at least a portion of the plurality of conductive fluid drops so as to render the at least one trace substantially permanent on said substrate.

2. The method of claim 1, wherein said forming an assembly having the at least one conductive trace comprises forming at least a portion of said at least one conductive trace having a thickness in a range of 20 μm to 100 μm.

3. The method of claim 1, wherein said apparatus configured to eject drops comprises a printhead including a nozzle.

4. The method of claim 3, wherein said conductive fluid comprises a plurality of conductive silver flakes contained within a fluid vehicle.

5. The method of claim 4, wherein 95% by weight of the plurality of silver flakes have a major dimension in a range of 2 μm to 20 μm.

6. The method of claim 5, wherein said substrate comprises at least a portion of a mobile electronic wireless device, and at least a portion of said at least one conductive trace comprises an antenna capable of transmitting and receiving electromagnetic energy.

7. The method of claim 1, wherein said ejecting the plurality of conductive fluid drops comprises ejecting drops having a dry volume that is in the range of 500 pL to 5000 pL.

8. The method of claim 1, wherein each drop of conductive fluid ejected by the apparatus has a dry volume that is in the range of 1000 pL to 2000 pL.

9. The method of claim 1, further comprising utilizing an adhesion promoter disposed in or on at least one of: (i) said substrate, and/or (ii) said conductive fluid, to promote adhesion of said at least one trace to said substrate.

10. The method of claim 1, wherein said causing transport of at least a portion of apparatus over a surface of the substrate while ejecting a plurality of conductive fluid drops to form the at least one conductive trace comprises using a plurality of individual strokes or motions while performing said ejecting, and said method further comprises varying at least one temporal relationship between at least two of the strokes or motions so as to achieve a desired physical property of said conductive trace before said heating.

11. An article of manufacture including an antenna formed upon a surface of a substrate, the antenna formed by a method comprising:
   providing a printhead including a nozzle that is configured to eject drops of a conductive fluid and not entrain said drops in a gaseous vehicle, the conductive fluid including conductive silver flakes in a fluid vehicle, each of the drops of the conductive fluid comprising a volume greater than or equal to 500 pL, whereby 95% by weight of the silver flakes have a major dimension in a range of 2 μm to 20 μm;
   securing the article in a fixture;
   transporting the printhead over a surface of the article while ejecting drops of the conductive fluid to form a fluid trace; and
   heating the fluid trace in an oven to remove at least a portion of the fluid vehicle, whereby a resultant trace comprises a thickness in a range of 20 μm to 100 μm.

12. The article of manufacturing of claim 11, wherein the resultant trace comprises a thickness in the range of 20 μm to 60 μm, and the thickness is configured to be at least two times that of a skin depth measured at 1 Ghz.

13. The article of manufacturing of claim 11, wherein the resultant trace comprises a thickness in the range of 30 μm to 40 μm, and the thickness is configured to be at least two times that of a skin depth measured at 1 Ghz.

14. The article of manufacturing of claim 11, wherein a skin depth measured at 1 Ghz is within a range of 4 μm to 15 μm.

15. The article of manufacturing of claim 11, wherein a skin depth measured at 1 Ghz is within a range of 8 μm to 15 μm.

16. The article of manufacturing of claim 11, wherein a single pass of the printhead results in a dry trace thickness of at least 20 μm to 100 μm, the thickness which is at least two times that of a skin depth measured at 1 Ghz.

17. The article of manufacture of claim 11, wherein each of a majority of the drops of the conductive fluid ejected by the printhead has a dry volume that is in a range of 500 pL and 5000 pL.

18. The article of manufacture of claim 17, wherein the each of the majority of the drops of the conductive fluid ejected by the printhead has a dry volume that is in a range of 1000 pL to 2000 pL.

19. The article of manufacture of claim 17, wherein the each of the majority of the drops of the conductive fluid is ejected onto the substrate and has a diameter in a range of 100 μm to 1000 μm.

20. The article of manufacture of claim 11, wherein the conductive fluid comprises the silver flakes, and wherein 95% of the silver flakes by weight have a major dimension between 6 μm and 16 μm inclusive.

21. The article of manufacture of claim 11, wherein the conductive fluid contains a plurality of silver flakes, 95% of the plurality of silver flakes by weight having a major dimension between 10 μm and 12 μm inclusive.

22. The article of manufacture of claim 11, wherein a fluid viscosity of the conductive fluid is in a range of 10 poise to 80 poise inclusive at 25 degree Celsius.

23. The article of manufacture of claim 11, wherein a fluid viscosity of the conductive fluid is in a range of 30 poise to 50 poise inclusive at 25 degree Celsius.

24. The article of manufacture of claim 11, wherein the nozzle has an exit diameter in a range of 50 μm to 300 μm inclusive.

25. The article of manufacture of claim 11, wherein the nozzle has an exit diameter between 70 μm and 200 μm inclusive.

26. An article of manufacture including an antenna formed upon a surface of a substrate using a printhead, the printhead including a nozzle that is configured to eject drops of a conductive fluid, each of the drops of the conductive fluid comprising a volume of 500 to 10,000 pL, the conductive fluid including conductive silver flakes in a fluid vehicle, whereby 95% by weight of the silver flakes have a major dimension in a range of 2 μm to 20 μm, the method comprising:
   securing the article in a fixture;
   transporting the printhead over a surface of the article while ejecting the drops of the conductive fluid to form a fluid trace, whereby each pass of the printhead forms a path segment comprising a dry trace thickness that is in a range of 20 μm to 100 μm and is at least two times a skin depth of a dry trace at an operating frequency of 1 GHz; and heating the fluid trace in an oven to remove at least a portion of the fluid vehicle.

27. The article of manufacturing of claim 26, wherein the dry trace thickness is at least three times that of the skin depth measured at 1 GHz.

28. The article of manufacturing of claim 27, wherein the dry trace comprises a thickness in the range of 30 μm to 50 μm inclusive.

29. The article of manufacturing of claim 27, wherein:
the skin depth measured at 1 Ghz is within a range of 4 μm to 15 μm inclusive; and
95% by weight of the silver flakes have a major dimension in a range of 6 μm to 16 μm inclusive.

30. A method of forming a conductive element on at least one surface of a substrate, the method comprising:
ejecting a plurality of portions of a flowable conductive material, each of the plurality of portions of the flowable conductive material comprising a volume of at least 500 pL and comprising a plurality of at least partly metallic flakes entrained in a fluid vehicle onto the substrate via at least one pass of a dispensing apparatus configured to perform said ejecting, the ejecting forming the conductive element so as to at least meet or exceed a prescribed ratio between a skin depth of the conductive element and an overall depth thereof at a prescribed frequency; and
curing said conductive element and said substrate as a unit so as to drive out at least a portion of said fluid vehicle from said conductive element, and render said conductive element at least substantially permanent.

* * * * *